(12) United States Patent
Hamby et al.

(10) Patent No.: US 8,669,517 B2
(45) Date of Patent: Mar. 11, 2014

(54) MASS ANALYSIS VARIABLE EXIT APERTURE

(75) Inventors: William O. Hamby, Sandwich, MA (US); Joseph Valinski, Newmarket, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 13/474,186

(22) Filed: May 17, 2012

(65) Prior Publication Data

US 2012/0298854 A1    Nov. 29, 2012

Related U.S. Application Data

(60) Provisional application No. 61/489,449, filed on May 24, 2011.

(51) Int. Cl.
 *H01J 37/30*   (2006.01)
 *H01J 49/00*   (2006.01)
(52) U.S. Cl.
 USPC ............... 250/281; 250/396 R; 250/492.3
(58) Field of Classification Search
 USPC ........... 250/281, 294, 298, 299, 396 R, 492.3
 See application file for complete search history.

(56) References Cited

U.S. PATENT DOCUMENTS

| | | | |
|---|---|---|---|
| 7,902,527 B2* | 3/2011 | Chen et al. | 250/492.21 |
| 2008/0142727 A1* | 6/2008 | Ryding et al. | 250/400 |
| 2009/0014667 A1* | 1/2009 | Hahto et al. | 250/492.21 |
| 2009/0108197 A1* | 4/2009 | Alcott et al. | 250/287 |
| 2009/0236547 A1* | 9/2009 | Huang et al. | 250/492.21 |
| 2009/0283703 A1* | 11/2009 | Tamura | 250/492.3 |
| 2010/0116983 A1* | 5/2010 | Benveniste et al. | 250/298 |
| 2010/0171047 A1* | 7/2010 | Matsuda et al. | 250/492.3 |

* cited by examiner

*Primary Examiner* — Robert Kim
*Assistant Examiner* — David E Smith
(74) *Attorney, Agent, or Firm* — Eschweiler & Associates, LLC

(57) ABSTRACT

A method and apparatus is provided for reducing unwanted isotopes of an ion implantation species from an ion beamline. The apparatus herein disclosed is a mass analysis variable exit aperture that selectively reduces the size of an exit aperture as seen by an ion beam. In one embodiment, the variable mass analysis exit aperture is located within a mass analyzer at a position upstream of a resolving aperture and effectively limits the size of an exit aperture so as to allow passage of desired implantation isotope(s) while blocking the passage of unwanted implantation isotopes. In one particular embodiment, the mass analysis variable exit aperture has a mechanical drive mechanism that enables a blocking structure to be moved into the path of an ion beam in a graduated fashion as guided by a control unit that operates based upon one or more characteristics of the ion beam.

20 Claims, 6 Drawing Sheets

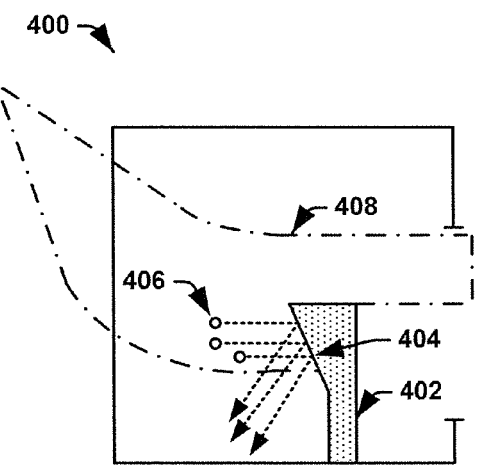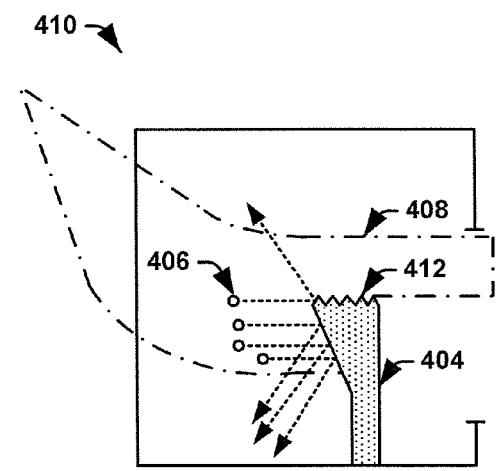
Fig. 4A               Fig. 4B
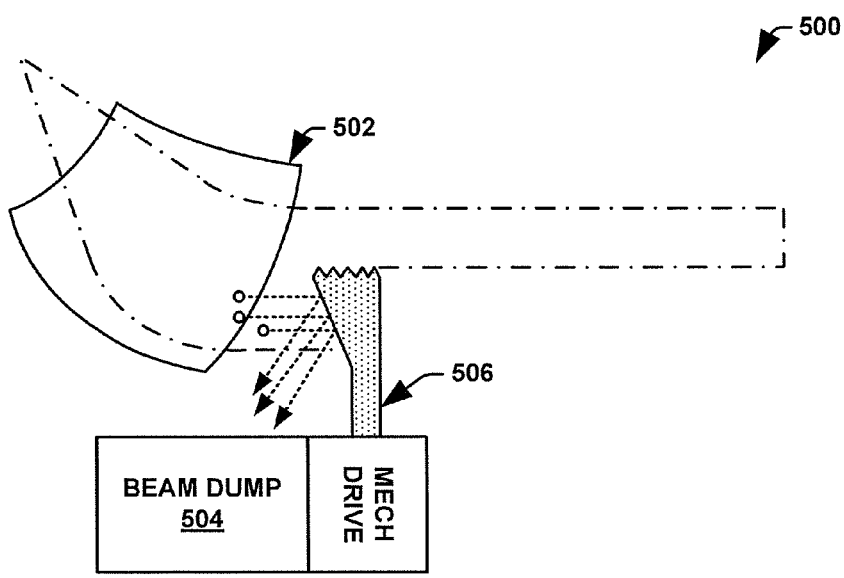
Fig. 5

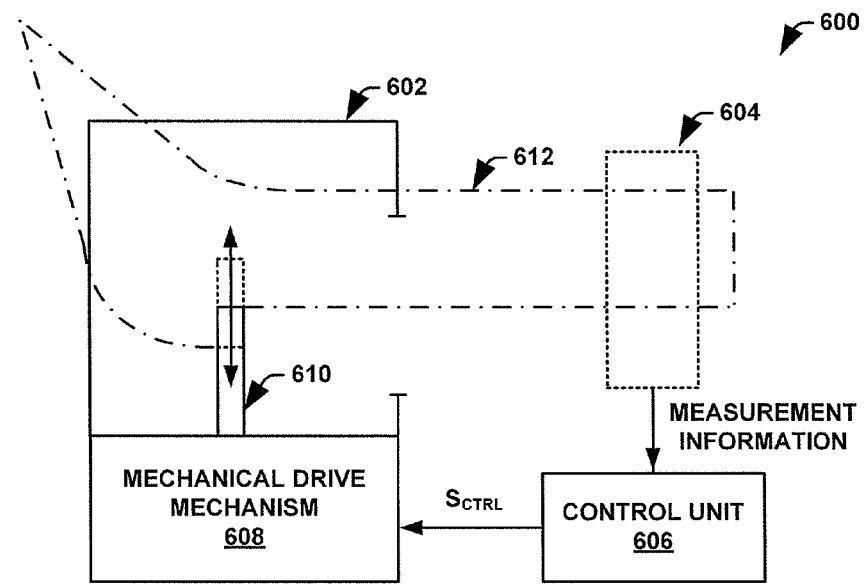
Fig. 6
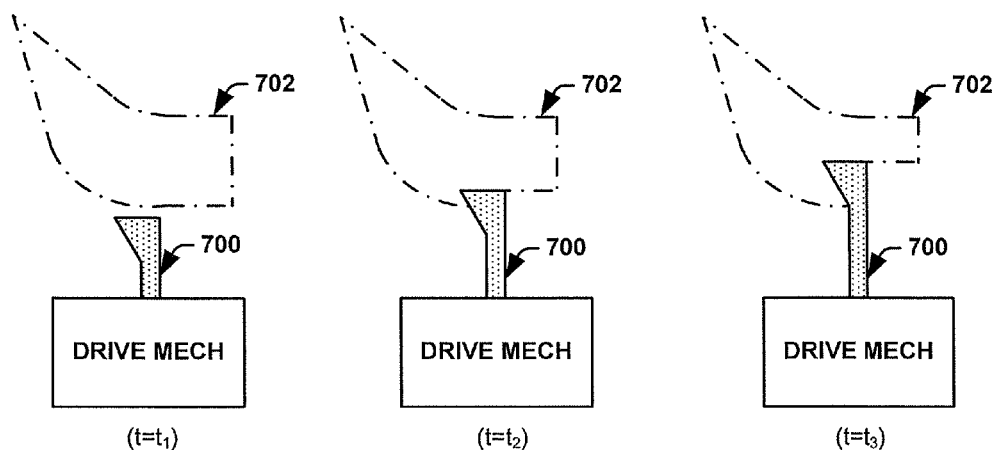
Fig. 7A  Fig. 7B  Fig. 7C

MASS ANALYSIS VARIABLE EXIT APERTURE

FIELD

The present invention relates generally to ion implantation systems, and more specifically to a method and apparatus for forming a variable size mass analyzer exit aperture configured to block unwanted implantation isotopes from propagating towards a workpiece.

BACKGROUND

Ion implantation is a physical process that is employed in semiconductor apparatus fabrication to selectively implant dopants into a semiconductor substrate (e.g., workpiece, wafer, etc.). Ion implantation can be performed in various ways in order to obtain a particular characteristic on or within a substrate. For example, the diffusivity of a dielectric layer on the substrate can be limited by implanting a specific type of ion into the substrate.

During implantation, one or more ion species, generated by an ion source, are provided to a mass analyzer. The mass analyzer is configured to receive the one or more ion species and to generate a dipole magnetic field that acts upon the ion species to select a particular ion species, based on the charge-to-mass ratio of the ions. The particular ion species is delivered to a downstream workpiece. In a typical serial implantation process the resulting ion beam may either be scanned across a single axis of a workpiece moving in the orthogonal direction, or alternatively a workpiece may be moved along a pair of orthogonal axes with respect to a stationary ion beam.

BRIEF DESCRIPTION OF THE DRAWINGS

FIGS. 4A-4B illustrate two non-limiting embodiments of exemplary blocking structures that may be used for a mass analysis variable exit aperture;

FIG. 5 illustrates a block diagram showing a particular embodiment of a mass analysis exit aperture configured to redirect unwanted isotopes to a beam dump;

FIG. 6 illustrates an ion implantation system comprising a mass analyzer having a mass analysis variable exit aperture that is controlled by a control system coupled to a downstream ion beam monitoring system;

FIGS. 7A-C illustrate a mass analysis exit aperture blocking structure at different positions within an ion beam;

DETAILED DESCRIPTION

Figure 1:
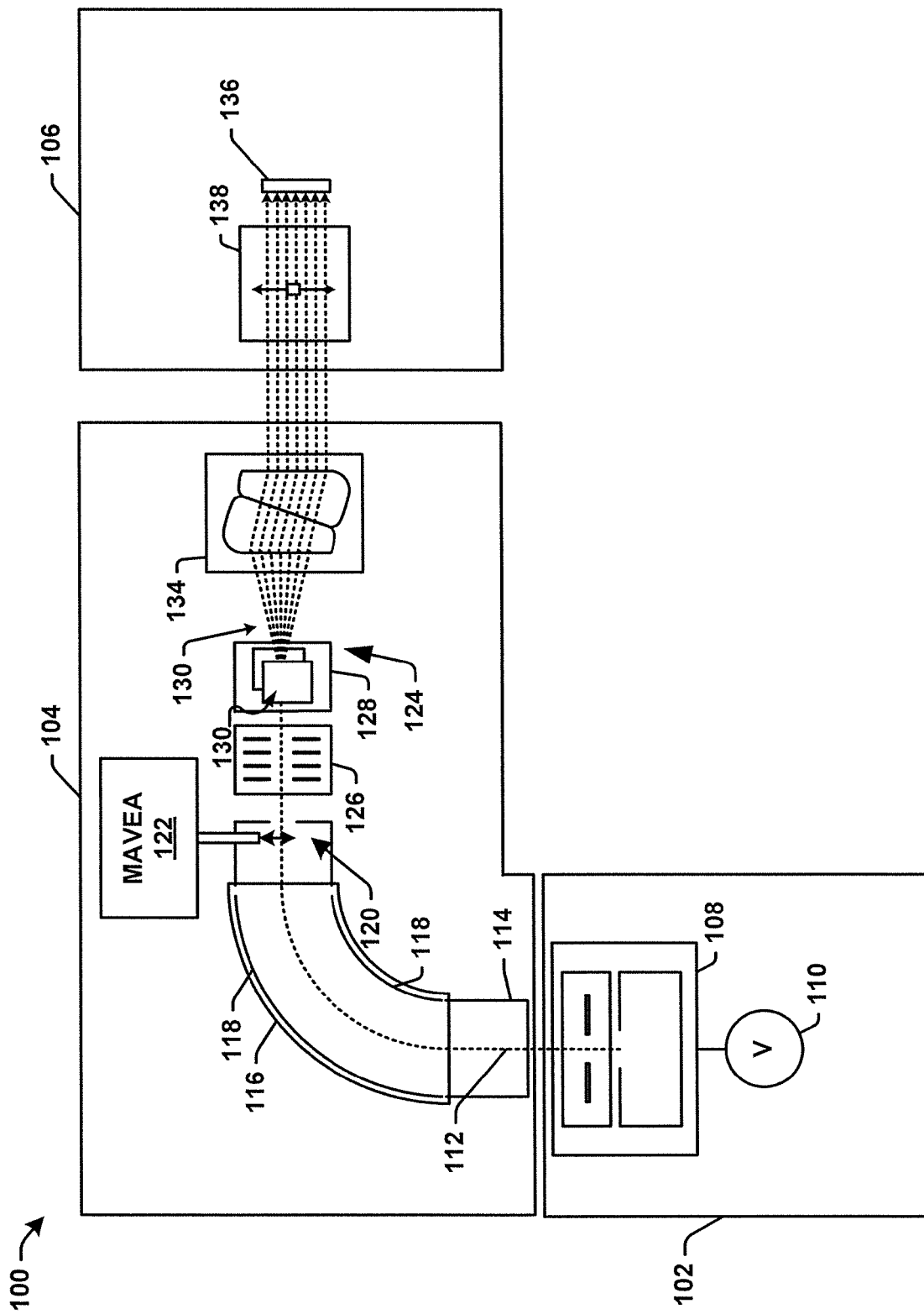
FIG. 1 is a block diagram illustrating an exemplary ion implantation system.

The present invention will now be described with reference to the drawings wherein like reference numerals are used to refer to like elements throughout.

As the reduction in size of semiconductor devices becomes more difficult new integrated chip fabrication techniques are constantly being developed. One such new fabrication technique relies more heavily upon certain species being used for implantations, such as germanium. Germanium is a species whose gas source, germanium tetrafluoride (GeF4), contains many isotope species over a small range of mass. The inventors have appreciated that due to the small range of mass spanned by different germanium isotopes, existing mass analyzers may be unable to effectively filter unwanted isotopes (i.e., the standard exit aperture of a mass analyzer does not act to prevent unwanted isotopes of closely massed species from exiting the resolving aperture). If such unwanted isotopes are not effectively filtered, they may cause erosion of beamline components and may lead to potential contamination of a workpiece.

Accordingly, a mass analysis variable exit aperture (MAVEA) that can selectively adjust the size of a mass analyzer exit aperture is disclosed. By selectively adjusting the size of the mass analyzer exit aperture, the MAVEA provides for high resolution selection between isotopes spanning a small range of mass within an ion beam. In some embodiments, the MAVEA is located within a mass analyzer configured to generate a magnetic field that bends a trajectory of isotopes within an ion beam according to their charge-to-mass ratio. The MAVEA is configured to selectively insert a blocking structure into the beamline to block a portion of the ion beam. Blocking a portion of the ion beam effectively limits the size of the exit aperture in a manner that allows passage of a selected implantation isotope while blocking the passage of closely massed unwanted isotopes.

FIG. 1 illustrates an exemplary ion implantation system 100 in accordance with an aspect of the present invention. The ion implantation system 100 is presented for illustrative purposes and it is appreciated that aspects of the invention are not limited to the described ion implantation system and that other suitable ion implantation systems can also be employed.

The ion implantation system 100 has a terminal 102, a beamline assembly 104, and an end station 106. The terminal 102 includes an ion source 108 powered by a high voltage power supply 110. The ion source 108 is configured to generate implantation isotopes (i.e., ions) that are extracted and formed into an ion beam 112, which is directed along a beamline in the beamline assembly 104 to the end station 106.

The beamline assembly 104 has a beamguide 114 and a mass analyzer 116. The mass analyzer 116, in this example, is formed at about a ninety degree angle and comprises one or more magnets (not shown) that serve to establish a (dipole) magnetic field therein. As the ion beam 112 enters the mass analyzer 116, implantation isotopes within the ion beam are bent by the magnetic field. Isotopes having different charge-to-mass are bent to have a radius of curvature inversely proportional to their mass, causing the ion beam to spread out in a manner that provides for isotopes of a like mass to be spatially together (e.g., heavier isotopes are located on an outer radius of an ion beam, lighter isotopes are located on an inner radius of an ion beam). Isotopes having too great or too small a charge-to-mass ratio are deflected into side walls 118 of the beamguide 114. In this manner, the mass analyzer 116 allows those isotopes in the ion beam 112 which have the desired charge-to-mass ratio to pass there-through and exit through a resolving aperture 120 comprising an opening located at the end of the mass analyzer 116.

A mass analysis variable exit aperture (MAVEA) 122 is located at a position within the beamline assembly 104 along the beamline. The MAVEA 122 is configured to penetrate a blocking structure into the beamline so as to block a portion of the ion beam 112. By blocking a portion of the ion beam 112, unwanted isotopes can effectively be removed from the beamline. In some embodiments, the MAVEA 122 is located upstream of the resolving aperture 120. In some embodiments, the MAVEA 122 is located within the mass analyzer 116 so that the MAVEA 122 removes unwanted isotopes from the beamline after it is spread out by the magnetic field. For example, in some embodiments, the MAVEA 122 is mounted in a beam guide which is, in turn, mounted between poles of mass analyzer AMU magnet(s). In alternative embodiments, the MAVEA 122 may be located at any other position within the beamline downstream from the AMU magnet(s).

In some embodiments, the MAVEA 122 comprises a blocking structure that is configured to penetrate the ion beam 112 from the outer radius of the mass analyzer 116. By penetrating the ion beam 112 from the outer radius, the MAVEA 122 can allow lighter isotopes to pass through the mass analyzer aperture while blocking the heavier isotopes, since the magnetic field of the mass analyzer 116 bends the lighter isotopes more than the heavier isotopes (i.e., isotopes having a greater atomic mass). For example, the mass analyzer 116 will bend germanium isotopes having a mass of 72 amu more than isotopes having a mass of 73 or 74, so that the 72 amu isotope is along the inner radius of curvature of the ion beam. Therefore, by penetrating the ion beam 112 from an outer radius, the MAVEA 122 can be operated to allow germanium isotopes having a mass of 72 amu to exit mass analyzer aperture while filtering germanium isotopes having an amu of 73, 74, etc out of the beamline.

As provided herein the MAVEA 122 is a separate and distinct structure from a downstream resolving aperture 120. For example, the MAVEA 122 comprises an ambulatory blocking structure that can be moved in and out of the beamline, while the resolving aperture comprises a fixed structure located at a position that is relative to the beamline to reject isotopes having an inappropriate charge-to-mass ratio. The MAVEA 122 and/or a combination of a resolving aperture 120 and the MAVEA 122 effectively form a mass analyzer exit aperture that allows for isotopes having a desired charge-to-mass ratio to exit the mass analyzer 116. In one embodiment, the resolving aperture 120 may be configured to have a relatively large size that allows a wide range of implantation species (e.g., that works with traditional implantation species such as B, P, etc. as well as Ge, C, etc.), while the MAVEA 122 is configured to reduce the relatively large size of the resolving aperture 120. This allows for the ion implantation system 100 to be used for a wide range of implantation species that have different filtering resolution needs (e.g., to have a wide aperture for B, and a narrow aperture for Ge).

In various embodiments, the ion implantation system 100 may comprise additional components. For example, as shown in FIG. 1, a magnetic scanning system 124, located downstream of the mass analyzer 116 includes a magnetic scanning element 128 and a magnetic or electrostatic focusing element 126. The scanned beam 130 is then passed through a parallelizer 132, which comprises two dipole magnets, that cause the scanned beam 130 to alter its path such that the scanned beam 130 travels parallel to a beam axis regardless of the scan angle. The end station 106 then receives the scanned beam 130 which is directed toward a workpiece 136. The end station 106 may comprise a dosimetry system 138 near the workpiece location for calibration measurements prior to or during implantation operations.

Figure 2:
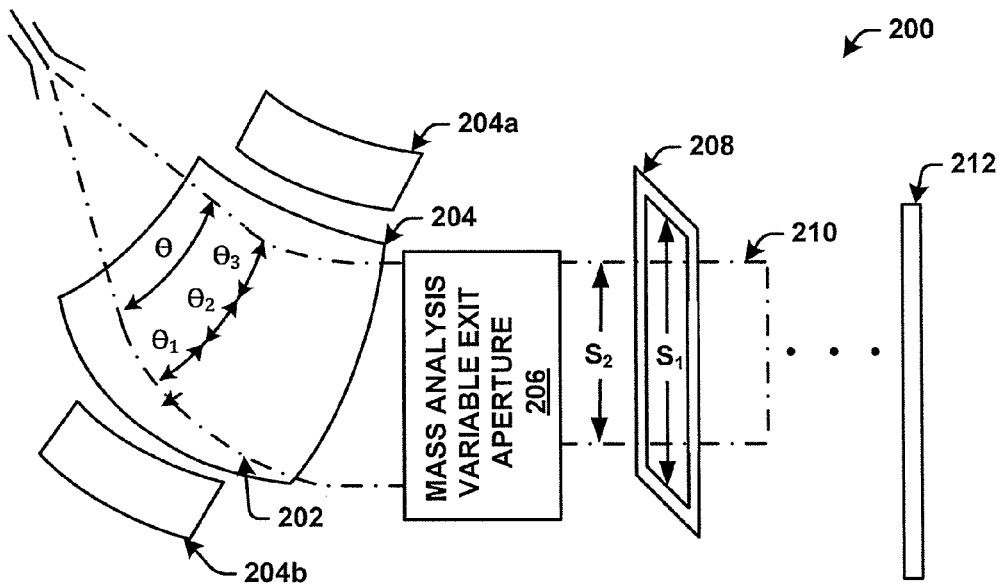
FIG. 2 illustrates an exemplary ion beam traveling through a mass analyzer having a mass analysis variable exit aperture.

FIG. 2 illustrates a block diagram of an ion implantation system 200 showing the operation of a disclosed MAVEA to block unwanted isotopes within an exemplary ion beam. The ion implantation system 200 comprises an exemplary ion beam 202 passing through a mass analyzer 204 located upstream of a workpiece 212. The mass analyzer 204 comprises one or more atomic mass unit (amu) magnets 204a-204b configured to generate a magnetic field that operates upon the ion beam 202 as it passes through the mass analyzer 204. The magnetic field operates upon the charged particles within the ion beam 202 (e.g., implantation isotopes) with a force (i.e., $F=v \times B$; where F is the force, v is the velocity of the charged particles, and B is the magnetic field) that causes the path of the ion beam particle's motion to bend.

Since the different implantation isotopes have different masses and therefore different momentums for equivalent acceleration, such bending causes the different implantation isotopes of the ion beam 202 to spread out over an angle θ, where different angles of the ion beam 202 will predominately contain different implantation isotopes. In general, heavier implantation isotopes will be bent less by the mass analyzer's magnetic field than lighter implantation isotopes (i.e., isotopes having a greater atomic mass will be bent less than isotopes having a smaller atomic mass). Therefore, the heavier implantation isotopes will be located along the outer radius of the ion beam 202, while lighter implantation isotopes will be located along the inner radius of the ion beam 202. For example, angle $\theta_1$ the ion beam 202 will contain the heaviest isotopes of the ion beam 202, angle $\theta_2$ will contain lighter isotopes than those within angle $\theta_1$, and angle $\theta_3$ will contain lighter isotopes than those within angles $\theta_1$ and $\theta_2$.

Because the mass analyzer 204 separates isotopes over the angle θ according to mass, a mass analysis variable exit aperture 206 may insert a blocking structure into the beamline to reduce the size of the exit aperture and thereby block unwanted implantation isotopes while allowing a preponderance of a selected implantation isotope to propagate down the beamline. As illustrated in FIG. 2, the mass analysis variable exit aperture 206 is configured upstream of a resolving aperture 208 located at the exit of the mass analyzer 204. The mass analysis variable exit aperture 206 is configured to block a cross sectional area of the ion beam path 202 to stop unwanted implantation isotopes from propagating down the beamline while allowing a selected implantation isotope to propagate down the beamline.

The mass analysis variable exit aperture 206 allows the exit aperture to be reduced below the size of the downstream resolving aperture 208 located at the exit of the mass analyzer 204. Therefore, the mass analysis variable exit aperture 206 provides for a greater resolution of filtering of unwanted isotopes than the fixed size resolving aperture 208. For example, the mass analysis variable exit aperture 206 is configured to perform a blocking of the ion beam path that reduces the size of the exit aperture to a size $S_2$ (i.e., to form a truncated ion beam). In contrast, the fixed size resolving aperture 208 has a size $S_1$, which may be larger than the size $S_2$ of the exit aperture provided by the mass analysis variable exit aperture 206.

The MAVEA 206 may be configured to penetrate the ion beam 202 from one or more sides. For example, in one embodiment, the MAVEA 206 may be configured to block the outside radius of the ion beam 202 (i.e., the "long" travel path of the ion beam). Such an embodiment allows for the MAVEA 206 to generally remove heavier isotopes of the implantation species. Alternatively, the MAVEA 206 may be configured to block the inside radius of the ion beam 202 (i.e., the "short" travel path of the ion beam). Such an embodiment allows for the MAVEA 206 to generally remove lighter isotopes of the implantation species. In yet another embodiment, MAVEA 206 may be configured to block both the outside and inside radii of the ion beam 202 therefore removing both lighter and heavier isotopes of the implantation species.

Therefore, by controlling the size of the upstream mass analysis variable exit aperture 206 relative to the resolving aperture 208, the mass analysis variable exit aperture 206 may be configured to reduce the size of mass analyzer exit aperture seen by the ion beam. This allows the resolving aperture 208 to have a relatively large size that allows a wide range of implantation species (e.g., that works with traditional implantation species such as B, P), while the upstream mass analysis variable exit aperture 206 may be configured to reduce the size of the exit aperture seen by the ion beam to provide for a reduced aperture size that may remove unwanted isotopes from implantation species having a small range of atomic masses.

Figure 3:
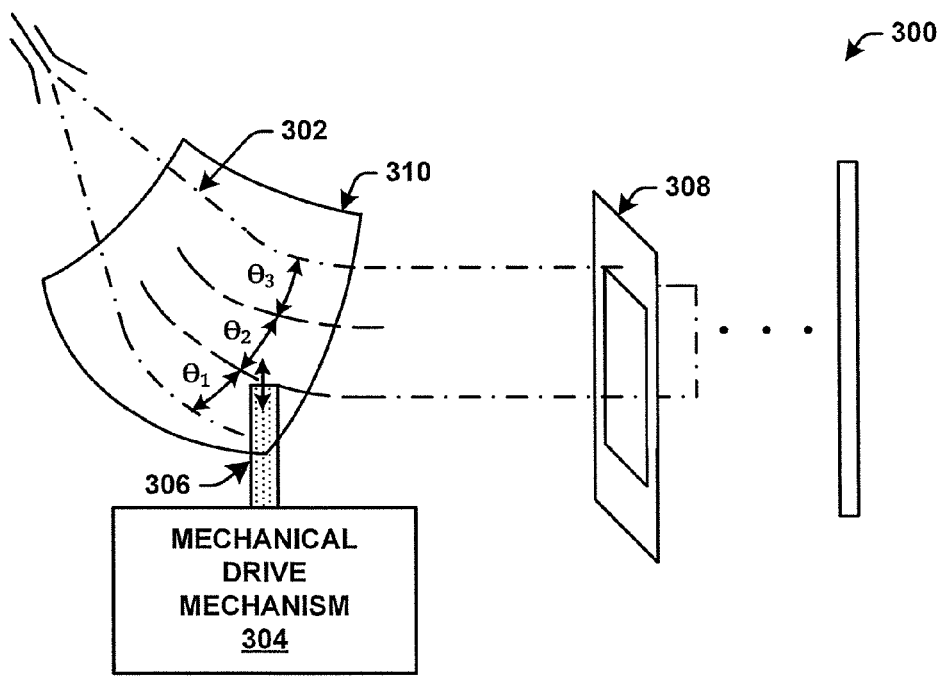
FIG. 3 illustrates an exemplary ion beam traveling through a mass analyzer having a mass analysis variable exit aperture comprising a blocking structure.

FIG. 3 illustrates a mass analysis variable exit aperture comprising a blocking structure 306 (i.e., blocking shield) that may be moved into the ion beam 302 along a path of unwanted ions (e.g., to block a cross sectional area of the ion beam 302 containing predominately unwanted implantation species) by way of a mechanical drive mechanism 304. The mechanical drive mechanism 304 is configured to dynamically adjust the location of the blocking structure 306 within the ion beam 302 in a graduated fashion. For example, the mechanical drive mechanism 304 may be configured to move the blocking structure 306 into and out of the ion beam 302. In one embodiment, the mechanical drive mechanism 304 may contain a linear actuator such as a worm gear drive mechanism, for example.

The mass analyzer exit aperture may be generated from a combination of the blocking structure 306 and a resolving aperture 308, so that the blocking structure 306 effectively reduces the size of the resolving aperture 308 below its normal, fixed size. For example, the mechanical drive mechanism is configured to penetrate the outside radius of the ion beam 302, removing unwanted species from the ion beam 302. The resulting ion beam is provided to the resolving aperture 308, which further blocks parts of the ion beam 302, further removing unwanted species from the ion beam 302. Therefore, the ion beam 302 that exits the resolving aperture 308 has been filtered by both the blocking structure 306 and the resolving aperture 308.

The blocking structure may comprise a wide range of shapes, sizes, and materials. In one embodiment, the blocking structure may be comprised of a graphite based material.

FIGS. 4A-4B illustrate two non-limiting embodiments of exemplary blocking shield shapes that may be used for a mass analysis variable exit aperture as provided herein.

In one embodiment, illustrated in FIG. 4A, the blocking structure 402 may comprise a wedge shaped structure having a sloped surface 404 that slopes away from an ion beam 408. The sloped surface 404 is configured to deflect unwanted isotopes 406 away from the ion beam 408. For example, as illustrated in FIG. 4A, the wedge shaped blocking structure enters the ion beam 408 from the outer radius of the ion beam path, such that the sloped surface 404 deflects unwanted isotopes away from the ion beam 408.

In some additional embodiments, illustrated in FIG. 4B, the blocking structure 402 may have a serrated surface 412 configured to deflect any unwanted ions 406 away from the ion beam 408 so that they don't travel down the beamline. For example, as illustrated in FIG. 4B the serrated surface 412 may be located on the "top" of the blocking structure 402 (i.e., on the portion of the blocking structure that first enters the ion beam 408).

In one embodiment, illustrated in FIG. 5, the mass analyzer 502 may comprise a beam dump 504 configured to collect unwanted isotopes that are deflected away from ion beam 508 by a blocking structure 506. The beam dump 504 may comprise a cavity located at a position that receives isotopes reflected from the blocking structure 506. For example, as illustrated in FIG. 5, the beam dump 504 is located at a position that collects isotopes reflected off of a wedge shaped surface of a blocking structure 506 configured to deflect unwanted isotopes. By collecting unwanted isotopes, the beam dump 504 ensures that the deflected, collected isotopes do not re-enter the beamline.

In some embodiments, monitoring one or more ion beam characteristics (e.g., ion beam current or shape) downstream from the mass analysis variable exit aperture can be performed. The monitored characteristics (e.g., beam current or shape) can then be utilized to determine an optimal location of the blocking structure. FIG. 6 illustrates an ion implantation system 600 comprising a mass analyzer 602 having a mass analysis variable exit aperture comprising a blocking structure 610 that is controlled by a control unit 606 coupled to an ion beam measurement element 604 located downstream of the blocking structure 610.

In some embodiments, the ion beam measurement element 604 comprises an ion beam measurement element 604 configured to describe a state of the ion beam by measuring one or more characteristics of the ion beam (e.g., beam current, beam profile, beam shape, etc.) at a location downstream of the mass analyzer 602. In one embodiment, the ion beam measurement element 604 may comprise a beam current measurement element such as a faraday cup. In an alternative embodiment, the ion beam measurement element 604 may comprise one or more profilers that may continuously traverse a profiler path, thereby measuring the profile of the scanned beams.

The measured characteristics of the ion beam are provided to a control unit 606. The control unit 606 is configured to perform analysis of the measured beam characteristic and to selectively generate a control signal $S_{CTRL}$ that adjusts the position of the blocking structure 610 within an ion beam 612. In one embodiment, the control unit 606 may be configured to iteratively change the location of the blocking structure 610 within the ion beam 612 in response to the measured characteristics of the ion beam. In some embodiments, the control unit 606 is configured to compare the measured beam characteristic to a predetermined threshold value. If the measured beam characteristic is greater than the predetermined threshold value, the control signal $S_{CTRL}$ will move the blocking structure 610 to increase the cross sectional area of the ion beam that is blocked. If the measured beam characteristic is less than the predetermined threshold value, the control signal $S_{CTRL}$ will move the blocking structure 610 to decrease the cross sectional area of the beam that is blocked.

In some embodiments, the control signal $S_{CTRL}$ is provided to a mechanical drive mechanism 608. The mechanical drive mechanism 608 is configured to control the location of the blocking structure 610, by moving the blocking structure 610 into and out of the ion beam 612 in a graduated fashion to incrementally increase (e.g., by blocking less of the ion beam path) or decrease (e.g., by blocking more of the ion beam path) the beam current to a desired beam current (e.g., based upon a predetermined threshold value). The final location of the blocking structure 610 may be determined by observation of a previously stabilized beam current while slowly moving the blocking structure 610 into the ion beam path until an unacceptable decrease in the beam current is seen (e.g., until the ion beam current violates a predetermined threshold value). The blocking structure 610 may then be slightly withdrawn until an acceptable minimum beam current is regained.

Figure 7D:
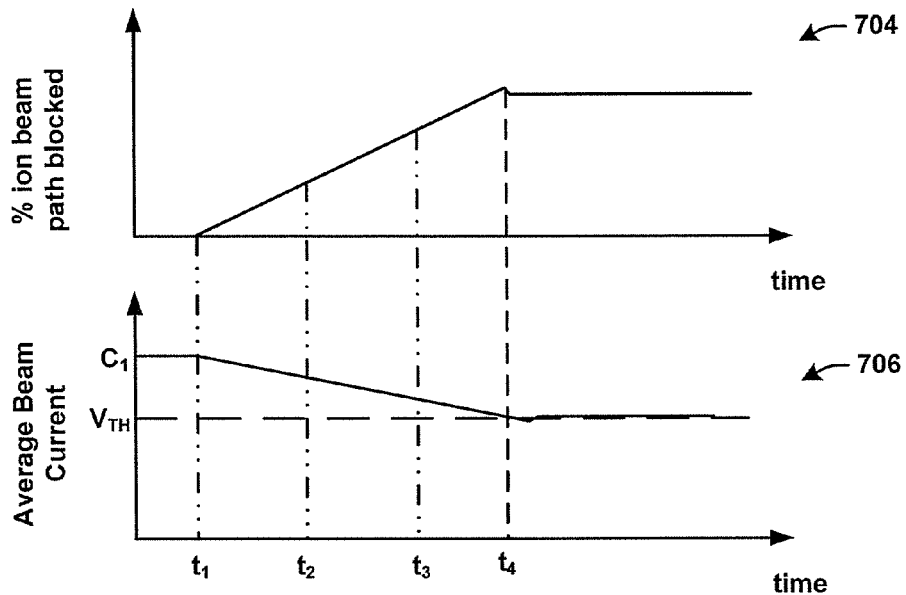
FIG. 7D illustrates graphs showing beam current and the percentage of the ion beam path being blocked as a function of time.

FIGS. 7A-D illustrate a more particular embodiment of a mass analysis variable exit aperture that is variably controlled by a control system coupled to a downstream beam current measurement device. FIGS. 7A-7C illustrate a mass analysis exit aperture blocking structure at different positions within a mass analyzer beam path. FIG. 7D illustrates graphs showing beam current (y-axis) as a function of time (x-axis) and the percentage of the ion beam being blocked (y-axis) as a function of time (x-axis).

Referring to FIG. 7A, at a first time $t=t_1$ the blocking structure 700 is outside of the ion beam 702. Referring to FIG. 7D, at time $t_1$ the percentage of the ion beam blocked is zero (graph 704) and the ion beam current is at a constant beam current $C_1$ (graph 706).

Referring to FIG. 7B, at a second time $t=t_2$ the blocking structure 700 is located at a position that blocks a portion of the ion beam 702. Referring to FIG. 7D, at time $t_2$ the percentage of the ion beam blocked has increased from $t_1$ (graph 704) and the ion beam current is has decreased from the constant beam current $C_1$ (graph 706).

Referring to FIG. 7C, at a third time $t=t_3$ the blocking structure 700 is located at a position that blocks a portion of the ion beam 702. Referring to FIG. 7D, at time $t_3$ the percentage of the ion beam blocked has increased from $t_2$ (graph 704) and the ion beam current is has further decreased from the constant beam current $C_1$ (graph 706).

The percentage of ion beam path blocked may be decreased until the measured ion beam current violates a predetermined threshold value $V_{TH}$. For example, as shown in FIG. 7D, at a time $t_4$, the ion beam current (graph 706) drops below the predetermined threshold value $V_{TH}$. When the ion beam current violates the predetermined threshold value $V_{TH}$ the percentage of ion beam blocked is increased to allow for a greater beam current that does not violate the predetermined threshold $V_{TH}$.

Figure 8:
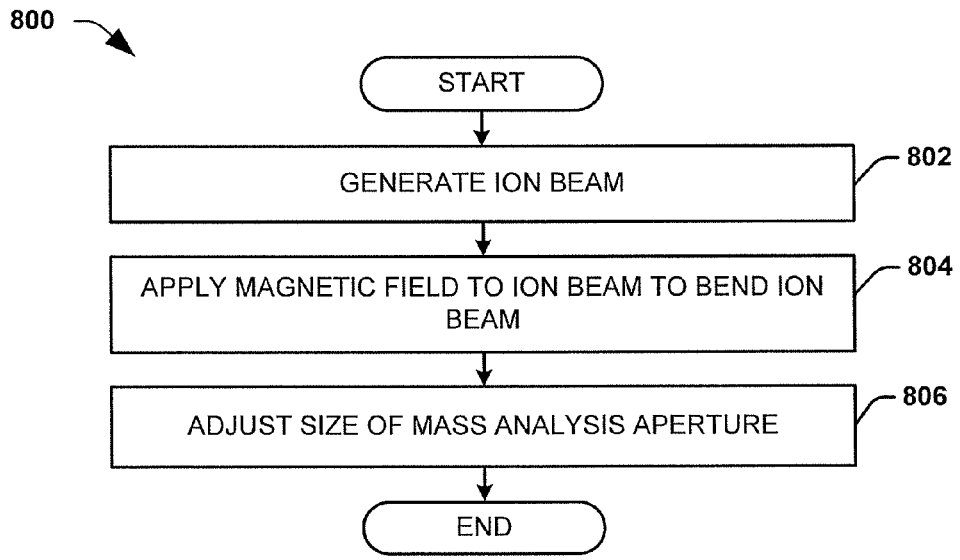
FIG. 8 illustrates some embodiments of a method for reducing unwanted isotopes of an ion implantation species from an ion beamline.

FIG. 8 illustrates one embodiment of an exemplary method 800 for reducing unwanted isotopes of an ion implantation species from an ion beamline. The method incrementally alters the size of an exit aperture to block a portion of the ion beam to prevent selected unwanted isotope species from exiting a mass analyzer.

While the methods provided herein (e.g., methods 800 and 900) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 802 an ion beam is generated. The ion beam comprises a plurality of isotopes having a range of atomic masses. For example, the ion beam may comprise Germanium isotopes spanning a mass range of 72-74 amu. The ion beam is configured to propagate along a beam line.

At 804 a magnetic field is applied to the ion beam. The magnetic field bends the trajectory of charged isotopes within the ion beam in a manner that is inversely proportional to the mass of the isotopes. In some embodiments, the magnetic field may comprise a dipole magnetic field generated by a mass analyzer, which is configured to bend different isotopes, having different masses, by a different angle. This results in an ion beam being spread over an angle, wherein different cross sectional areas of the ion beam predominately contain different implantation isotopes.

At 806 a size of a mass analysis variable exit aperture is adjusted. The size of the mass analysis variable exit aperture may be adjusted in a manner that blocks a portion of the ion beam to prevent selected species of an isotope from exiting a mass analyzer unit. In one embodiment, the mass analysis variable exit aperture may work in concert with the resolving aperture to dynamically adjust a size of a mass analyzer exit aperture. In one embodiment, the mass analysis variable exit aperture may be iteratively adjusted.

Figure 9:
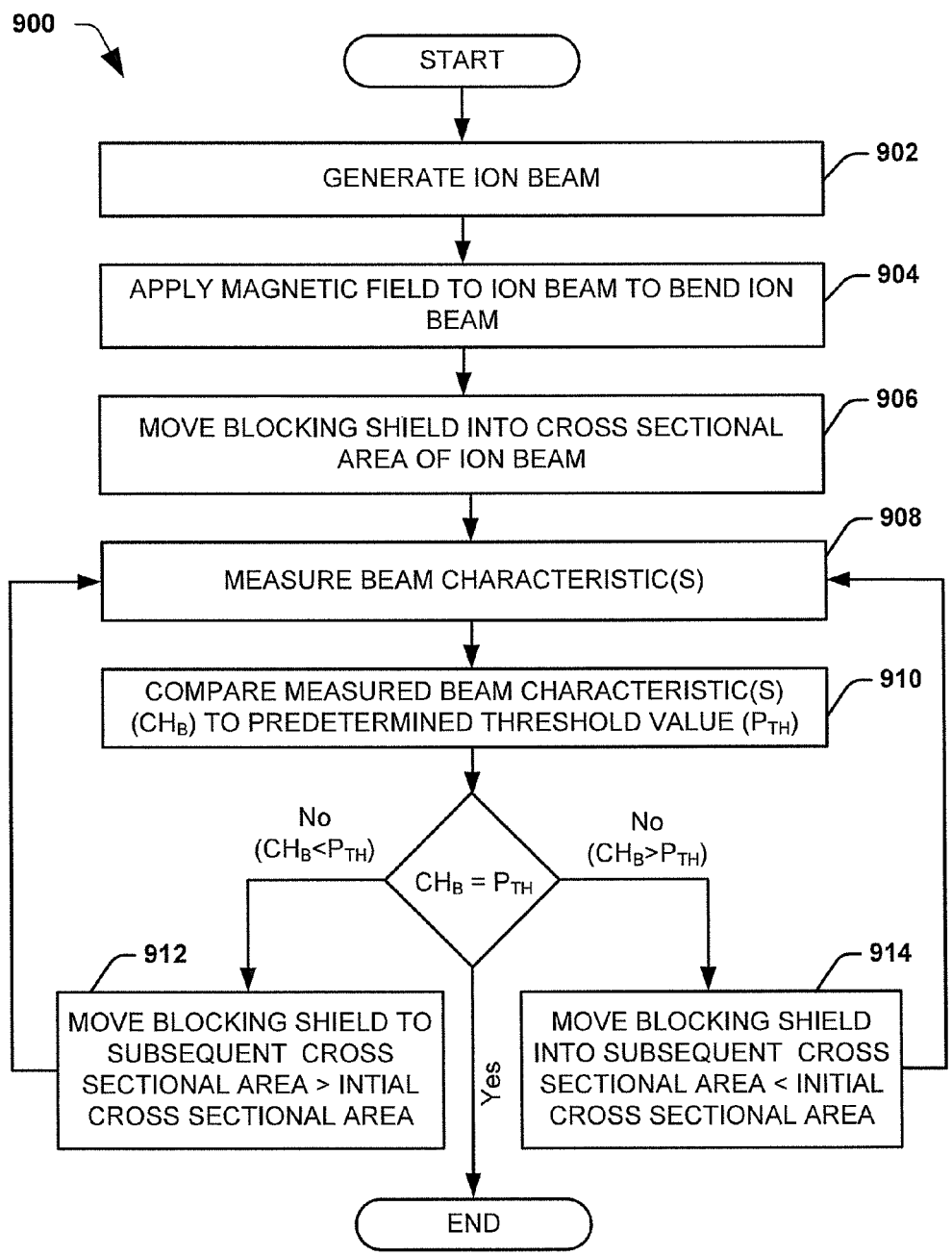
FIG. 9 illustrates some more detailed embodiments of a method for reducing unwanted implantation species from an ion beamline.

FIG. 9 illustrates a more detailed embodiment of an exemplary method 900 for reducing unwanted isotopes of an ion implantation species from an ion beam.

At 902 an ion beam comprising a plurality of charged isotopes is generated. In one embodiment, to generate the charged isotopes, free electrons within a gas of a dopant material to be ionized may be exited. It will be appreciated that any number of suitable mechanisms can be used to excite free electrons, such as RF or microwave excitation sources, electron beam injection sources, electromagnetic sources and/or a cathode which creates an arc discharge within the chamber, for example. The excited electrons collide with the dopant gas molecules and generate charged isotopes. Typically, positively charged isotopes are generated although the disclosure herein is applicable to systems wherein negatively charged isotopes are generated as well.

At 904 a magnetic field is applied to the ion beam. The magnetic field bends isotopes within the ion beam by applying a magnetic force upon charged particles within the ion beam. The magnetic force will bend the trajectory of the isotopes as a function of their mass, with smaller massed isotopes being bent more than larger massed isotopes.

At 906 a blocking structure is moved into a cross sectional area of the ion beam. Because the different mass isotopes are generally spread out over the beam path angle by the magnetic field, blocking a part of the ion beam will greatly reduce the unwanted isotopes while minimally affecting the wanted isotope species. For example, extending the blocking structure into the outer circumference of the ion beam will greatly reduce the number of heavy isotopes (i.e., isotope species that are heavier than the desired isotope) while minimally reducing the desired isotopes.

At 908 one or more characteristics of the ion beam are measured. In some embodiments, the one or more characteristics may comprise a beam current of the ion beam. The ion beam current may be measured by a faraday cup, in one embodiment. In some embodiments, the one or more characteristics of the ion beam are measured downstream of the blocking structure.

At 910 the measured beam characteristics are compared to predetermined threshold values. If the measured beam characteristics do not violate (e.g., is equal to) the predetermined thresholds, then the blocking structure is not moved and the method ends.

However, if the measured beam characteristics violate (e.g., is not equal to) the predetermined thresholds, then the blocking structure is moved. In particular, if a measured beam characteristic is less than the predetermined threshold the blocking structure is moved to a position that blocks a larger cross sectional area at 912. If the measured beam characteristic is greater than the predetermined threshold then the blocking structure is moved to a position that blocks a smaller cross sectional area (e.g., smaller than the pervious cross sectional area) at 914

The one or more beam characteristics (e.g., current density, profile) are then measured again at 908, and steps 910-914 may be repeated until an optimal location for the blocking structure is achieved (i.e., until the measured beam characteristic is equal to the predetermined threshold).

Although the invention has been shown and described with respect to certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementation of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An ion implantation system, comprising:
   an ion source configured to generate an ion beam comprising a plurality of isotopes that propagate along a beamline;
   a mass analyzer configured to generate a magnetic field that bends a trajectory of respective isotopes within the ion beam based upon a charge-to-mass ratio of the isotopes;
   a mass analysis variable exit aperture configured to insert an ambulatory blocking structure into the ion beam that prevents isotopes within a cross sectional area of the ion beam from propagating down the beamline; and
   a resolving aperture comprising an opening with a fixed size located downstream from the mass analyzer, wherein the opening is positioned relative to the ion beam so as to reject ions of an inappropriate charge-to-mass ratio;
   wherein the ambulatory blocking structure comprises a wedge shaped structure configured to deflect isotopes having a selected charge-to-mass ratio away from the beamline, which tapers from a thick end that enters the beamline first to a thin end that enters the beamline at a later time.

2. The ion implantation system of claim 1, wherein the mass analysis variable exit aperture is located upstream of the resolving aperture.

3. The ion implantation system of claim 2, wherein the mass analysis variable exit aperture is located within the mass analyzer.

4. The ion implantation system of claim 1, wherein the wedge shaped structure has a slanted slide that is incident to the ion beam and that slopes away from the ion beam.

5. The ion implantation system of claim 4, further comprising:
   a beam dump comprising a cavity configured to collect isotopes that are deflected away from the beamline by the ambulatory blocking structure, thereby preventing the collected isotopes from re-entering the beamline.

6. The ion implantation system of claim 4, wherein the ambulatory blocking structure comprises a serrated surface on the thick end of the wedge shaped structure configured to deflect isotopes having a selected charge-to-mass ratio away from the beamline.

7. The ion implantation system of claim 1,
   wherein the magnetic field bends the trajectory of respective isotopes so that heavier isotopes are located along an outer radius of the ion beam and lighter isotopes are located along an inner radius of the ion beam;
   wherein the ambulatory blocking structure is configured to enter into the ion beam from the outer radius to block the heavier isotopes, or to enter into the ion beam from the inner radius to block the lighter isotopes, without blocking a selected implantation isotope that is to be provided to a workpiece.

8. The ion implantation system of claim 1, further comprising:
   a mechanical drive mechanism configured to dynamically adjust a location of the ambulatory blocking structure within the ion beam.

9. The ion implantation system of claim 1, further comprising:
   an ion beam monitoring system located downstream of the mass analysis variable exit aperture and configured to measure one or more characteristics of the ion beam; and
   a control unit configured to receive the measured one or more characteristics of the ion beam and to move the blocking structure into the ion beam to increase the percentage of the ion beam path blocked until the measured one or more characteristics of the ion beam violate a predetermined threshold value.

10. The ion implantation system of claim 9, wherein the ion beam monitoring system comprises:
    an ion beam measurement element configured to describe the state of the ion beam.

11. An analyzer beamline operational train, comprising:
    an ion source configured to generate an ion beam comprising a plurality of isotopes that propagate along a beamline;
    a mass analyzer configured to generate a magnetic field that bends a trajectory of respective isotopes within the ion beam based upon a charge-to-mass ratio of the isotopes;
    a mass analysis variable exit aperture configured to penetrate a blocking structure into the ion beam that deflects isotopes away from the beamline, wherein the blocking structure allows for one isotope species to propagate down the beamline and prevents other closely massed isotope species from propagating down the beamline;
    a resolving aperture comprising an opening with a fixed size located downstream from the mass analyzer, wherein the opening is positioned relative to the ion beam so as to reject ions of an inappropriate charge-to-mass ratio; and
    a beam dump comprising a cavity configured to collect isotopes that are deflected away from the beamline by the blocking structure, thereby preventing the collected isotopes from re-entering the beamline.

12. The beamline operational train of claim 11, wherein the blocking structure comprises a wedge shaped structure configured to deflect isotopes having a selected charge-to-mass ratio away from the beamline, which tapers from a thick end that enters the beamline first to a thin end that enters the beamline at a later time.

13. The beamline operational train of claim 11, further comprising:
- an ion beam monitoring system located downstream of the mass analysis variable exit aperture and configured to measure one or more characteristics of the ion beam; and
- a control unit configured to receive the measured one or more characteristics of the ion beam and to move the blocking structure into the ion beam to increase the percentage of the ion beam path blocked until the measured one or more characteristics of the ion beam violate a predetermined threshold value.

14. A method for removing unwanted isotopes of an ion implantation species from an ion beam, comprising:
- generating an ion beam comprising a plurality of isotopes, wherein the ion beam propagates along a beamline;
- applying a magnetic field to the ion beam to provide heavier isotopes along an outer radius and lighter isotopes along an inner radius; and
- moving a blocking structure into a cross sectional area of the ion beam to reduce the size of a mass analyzer exit aperture to allow isotopes having a first mass to propagate down the beamline and to block other closely massed isotopes from propagating down the beamline;
- wherein the blocking structure comprises a wedge shaped structure configured to deflect isotopes having a selected charge-to-mass ratio away from the beamline, which has a slanted slide that is incident to the ion beam and that slopes away from the ion beam.

15. The method of claim 14, wherein the blocking structure is configured to enter into the ion beam from the outer radius so as to block isotopes that are heavier than a selected implantation isotope.

16. The method of claim 14, wherein the wedge shaped structure tapers from a thick end that enters the beamline first to a thin end that enters the beamline at a later time.

17. The method of claim 16, further comprising:
- collecting isotopes deflected away from the beamline by the blocking structure within a cavity to prevent the ions from re-entering the beamline.

18. The method of claim 14, further comprising:
- measuring an ion beam current of the ion beam at a location downstream of the blocking structure; and
- moving the blocking structure into the ion beam to increase the percentage of the ion beam path blocked until the measured ion beam current violates a predetermined threshold value.

19. The method of claim 1, wherein the ion beam comprises germanium isotopes spanning a mass range of between 72 atomic mass units and 74 atomic mass units.

20. The beamline operational train of claim 12, wherein the wedge shaped structure has a slanted slide that is incident to the incoming ion beam and that slopes away from the ion beam.

* * * * *